US008459293B2

(12) United States Patent
Griffin

(10) Patent No.: US 8,459,293 B2
(45) Date of Patent: Jun. 11, 2013

(54) AMPOULE WITH INTEGRATED HYBRID VALVE

(75) Inventor: Kevin S. Griffin, Livermore, CA (US)

(73) Assignee: Applied Materials, Inc., Santa Clara, CA (US)

( * ) Notice: Subject to any disclaimer, the term of this patent is extended or adjusted under 35 U.S.C. 154(b) by 433 days.

(21) Appl. No.: 12/766,565

(22) Filed: Apr. 23, 2010

(65) Prior Publication Data
US 2010/0269937 A1 Oct. 28, 2010

Related U.S. Application Data

(60) Provisional application No. 61/172,662, filed on Apr. 24, 2009.

(51) Int. Cl.
E03B 1/00 (2006.01)
F16L 37/23 (2006.01)

(52) U.S. Cl.
USPC .............. 137/205.5; 137/383; 251/63.5

(58) Field of Classification Search
USPC ........ 137/587, 614, 205.5, 368; 251/61–63.6, 251/89–116
See application file for complete search history.

(56) References Cited

U.S. PATENT DOCUMENTS

| | | | | |
|---|---|---|---|---|
| 4,252,021 A | * | 2/1981 | Drushel | 73/863.72 |
| 4,723,967 A | * | 2/1988 | Tom | 95/90 |
| 6,179,925 B1 | | 1/2001 | Schmitt et al. | |
| 2002/0189709 A1 | | 12/2002 | Noah et al. | |
| 2005/0000427 A1 | | 1/2005 | Lee et al. | |
| 2005/0000570 A1 | * | 1/2005 | Mohammed et al. | 137/487.5 |
| 2005/0217575 A1 | | 10/2005 | Gealy et al. | |
| 2006/0054018 A1 | * | 3/2006 | Brestovansky et al. | 95/95 |
| 2007/0006922 A1 | * | 1/2007 | Nesbitt | 137/383 |
| 2007/0079759 A1 | | 4/2007 | Lee et al. | |
| 2008/0041310 A1 | | 2/2008 | Gregg et al. | |
| 2008/0085226 A1 | * | 4/2008 | Fondurulia et al. | 422/198 |
| 2008/0099933 A1 | | 5/2008 | Choi et al. | |
| 2008/0149031 A1 | | 6/2008 | Chu et al. | |

OTHER PUBLICATIONS

International Search Report for PCT application PCT/US2010/032184 (Nov. 16, 2010).

* cited by examiner

Primary Examiner — John Rivell
Assistant Examiner — Seth Faulb
(74) Attorney, Agent, or Firm — Kilpatrick Townsend & Stockton LLP

(57) ABSTRACT

Semiconductor manufacturing tools with chemical delivery systems, such as precursor distribution system, use reservoir assemblies as part of a distribution system. One reservoir assembly includes: a canister comprising at least one sidewall, a top, and a bottom encompassing an interior volume therein; an inlet port and an outlet port in fluid communication with the interior volume; an inlet valve for controlling fluid communication between the inlet port and the interior volume; and an outlet valve for controlling fluid communication between the outlet port and the interior volume, wherein at least one of the inlet valve or the outlet valve comprises a dual-function hybrid valve.

17 Claims, 4 Drawing Sheets

AMPOULE WITH INTEGRATED HYBRID VALVE

CROSS-REFERENCE TO RELATED APPLICATIONS

This application claims the benefit of U.S. Provisional Application No. 61/172,662, filed Apr. 24, 2009, which is incorporated herein by reference in its entirety for all purposes.

BACKGROUND

Many of the chemicals used in the semiconductor industry are fed into a reactor chamber by way of a carrier gas. In a common approach, the carrier gas "picks up" one or more chemicals when the carrier gas is passed through an ampoule reservoir containing the chemical(s). Depending on the method of delivery, the ampoule may be installed in a precursor distribution system (PDS) enclosure.

A network of manual and automated valves are typically required for the safe use, servicing and replacement of ampoules. The network of valves is used for various purposes, such as isolation, diversion, pump-purge and delivery. A traditional ampoule reservoir assembly includes a canister that is in fluid communication with an inlet port and an outlet port. A manual lock-out tag-out valve and a pneumatic valve are connected in series between the canister and the inlet port. Similarly, a manual lock-out tag-out valve and a pneumatic valve are connected in series between the canister and the outlet port. The lock-out tag-out valves provide a secure way to prevent fluid from escaping from the canister. The pneumatic valves provide for automated control of fluid communication of: 1) the carrier gas entering the inlet port, and 2) the combination of carrier gas and precursor exiting the outlet port.

However, traditional reservoir assemblies suffer from a number of functional drawbacks. For example, some of the chemicals used in semiconductor manufacturing must be maintained within well defined temperature and pressure ranges to minimize condensation and/or decomposition of the chemicals. The traditional reservoir configuration of having the manual and pneumatic valve connected in series results in a tortuous fluid pathway and an odd physical shape, both of which interfere with maintaining the chemicals within a required temperature range. Additionally, the traditional reservoir assembly takes up a considerable amount of space and has less than optimum servicing and/or replacement characteristics.

Therefore, a system that can maintain chemicals within well defined temperature and pressure ranges while taking up less space is needed.

BRIEF SUMMARY

Disclosed embodiments pertain to improved reservoir assemblies that have a number of advantages over comparable traditional assemblies, such as requiring less space, better servicing and/or replacement characteristics, and better thermal characteristics. Disclosed embodiments improve the storing of chemicals that must be maintained within well defined temperature and pressure ranges, by providing more compact reservoir assemblies.

In accordance with an embodiment, a reservoir assembly includes a canister with at least one sidewall, a top, and a bottom that encompass an interior volume therein. The reservoir assembly further includes an inlet port in fluid communication with the interior volume and an outlet port in fluid communication with the interior volume. The reservoir assembly also includes an inlet valve for controlling fluid communication between the inlet port and the interior volume. The reservoir assembly also includes an outlet valve for controlling fluid communication between the outlet port and the interior volume. At least one of the inlet valve or the outlet valve includes a dual-function hybrid valve.

In another embodiment, a distribution system includes a reservoir assembly, an inlet fluid line and an outlet fluid line. The reservoir assembly includes a canister, which includes at least one sidewall, a top, and a bottom encompassing a volume therein. The reservoir assembly includes an inlet port, an outlet port, and a fill port, each of which are in fluid communication with the interior volume. The inlet port and the outlet port are configured to couple with the inlet fluid line and the outlet fluid line respectively. The reservoir assembly includes an inlet valve for controlling fluid communication between the inlet port and the interior volume. The reservoir assembly includes an outlet valve for controlling fluid communication between the outlet port and the interior volume. The reservoir assembly includes a fill valve for controlling fluid communication between the fill port and the interior volume. The inlet valve, the outlet valve and the fill valve are demountably coupled with the canister and each of the valves includes a dual-function hybrid valve.

For a fuller understanding of the nature and advantages of the present invention, reference should be made to the ensuing detailed description and the accompanying drawings. Other aspects, objects and advantages of the invention will be apparent from the drawings and the detailed description that follows. It should be understood that the detailed description and specific examples, while indicating various embodiments, are intended for purposes of illustration only and are not intended to necessarily limit the scope of the disclosure.

BRIEF DESCRIPTION OF THE DRAWINGS

A further understanding of the nature and advantages of the invention may be realized by reference to the remaining portions of the specification and the drawings, presented below. The figures are incorporated into the detailed description section below.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In accordance with various aspects and embodiments described herein, improved reservoir assemblies are provided. Such reservoir assemblies can be particularly advantageous when used in connection with a precursor distribution system (PDS) and/or in connection with semiconductor manufacturing.

Although embodiments are described with reference to applications in a precursor delivery system used in semiconductor manufacturing, it is to be understood that the field of the invention is not necessarily limited to these applications.

Reservoir assemblies can include one or more manual lock-out tag-out valves connected in series with one or more pneumatic valves for controlling fluid communication between a reservoir canister and an inlet port. Likewise, a reservoir assembly can include one or more manual lock-out tag-out valves connected in series with one or more pneumatic valves for controlling fluid communication between the canister and an outlet port. The lock-out tag-out valves provide a secure way to prevent fluid from escaping from the canister. The pneumatic valves provide for automated control of fluid communication of: 1) the carrier gas entering the inlet port, and 2) the combination of carrier gas and precursor exiting the outlet port.

Reservoir assemblies can be used to store harsh and/or sensitive chemicals such as chemicals used in semiconductor manufacturing processes. Some of the chemicals used in semiconductor manufacturing must be maintained within well defined temperature and pressure ranges to minimize condensation and/or decomposition of the chemicals. Disclosed embodiments provide alternatives to having manual and pneumatic valves connected in series, which results in tortuous fluid pathways and odd physical shapes, both of which interfere with maintaining the chemicals within a required temperature range. Disclosed embodiments provide reservoir assemblies that take up less space than traditional reservoir assemblies. Disclosed embodiments also provide reservoir assemblies with improved servicing and/or replacement characteristics as compared to traditional reservoir assemblies.

Figure 1:
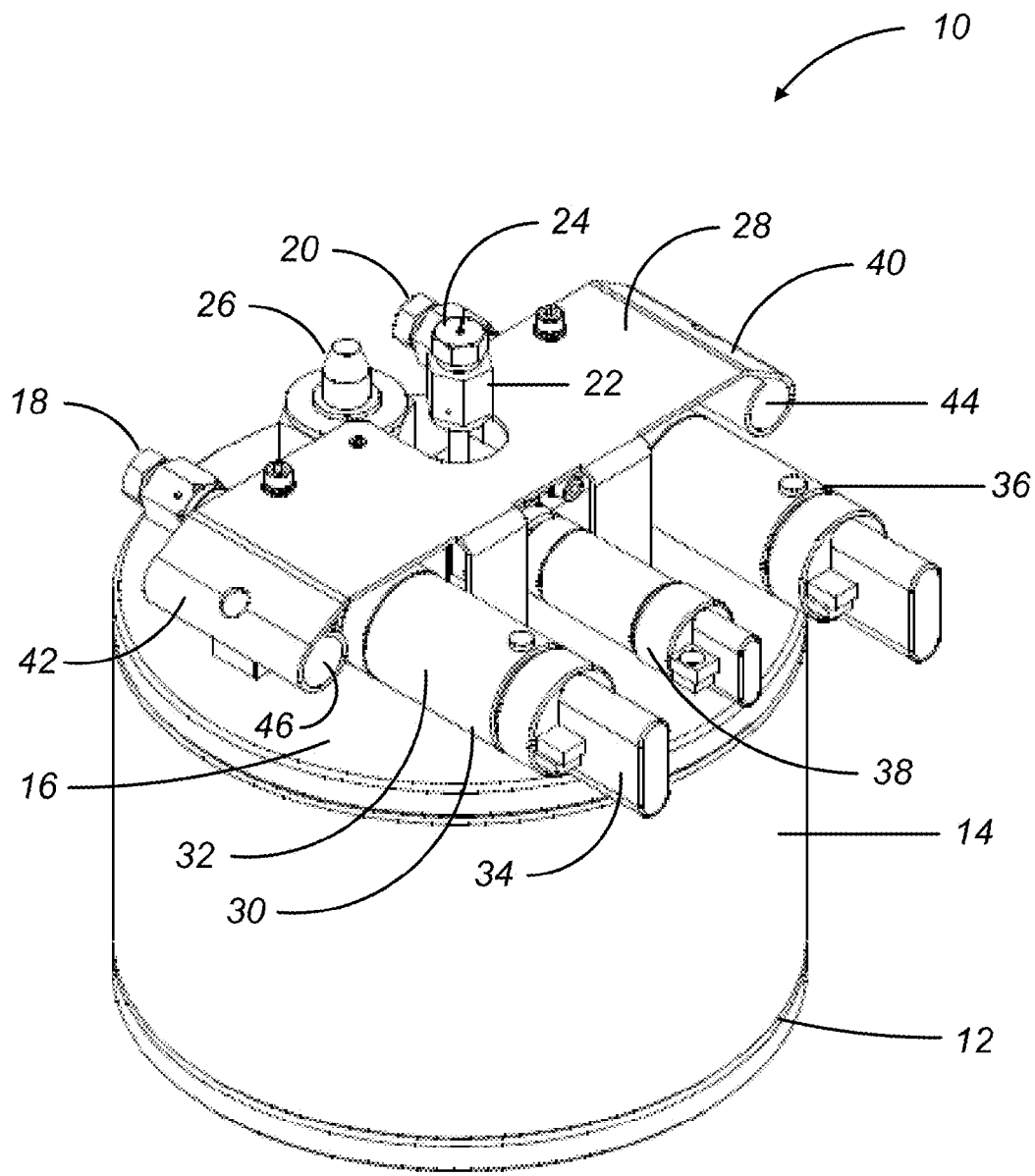
FIG. 1 is a perspective view of a reservoir assembly, as described in embodiments herein.

Referring to the drawings, with specific reference to FIG. 1, a reservoir assembly, in accordance with embodiments, is generally indicated by reference numeral 10. Reservoir assembly 10 includes a canister 12 having a cylindrical sidewall 14, a bottom (not shown) and a top 16. The canister is configured to contain a fluid or a gas, such as a precursor chemical used in semiconductor manufacturing. The reservoir assembly 10 includes an inlet port 18, an outlet port 20, a fill port 22 (shown with a fill port plug 24 installed), a level sensor assembly 26, and a handle assembly 28. Fluid communication between the inlet port 18 and the canister 12 is controlled by a dual-function hybrid inlet valve 30. The dual-function hybrid inlet valve 30 includes a pneumatic valve portion 32 and a manual lock-out tag-out module 34. Dual-function hybrid valves are commercially available. For example, dual-function hybrid valves are available from Fujikin of America, Inc. While the illustrated dual-function hybrid valve employs a pneumatic valve, other types of valves (e.g., electric valves) can be used. Fluid communication between the outlet port 20 and the canister is controlled by a dual-function hybrid outlet valve 36. Fluid communication between the fill port 22 and the canister 12 can be controlled by a dual-function hybrid fill valve 38, which provides the ability to automatically refill the canister during use. The level sensor assembly 26 monitors the level of the fluid within canister 12. The handle assembly 28 includes two gripping surfaces 40, 42 that surround two horizontally oriented receptacles 44, 46. The receptacles 44, 46 can be used to receive lifting members (not shown), which can be used to move the reservoir assembly (e.g., during installation of the reservoir assembly into a precursor distribution system (PDS), or removal from a PDS). The handle assembly 28 can be configured so that it can be attached and detached from the canister 12. The handle assembly can also be configured so as to provide a shield for portions of the reservoir assembly, such as components that may be susceptible to impact damage.

Figure 2:
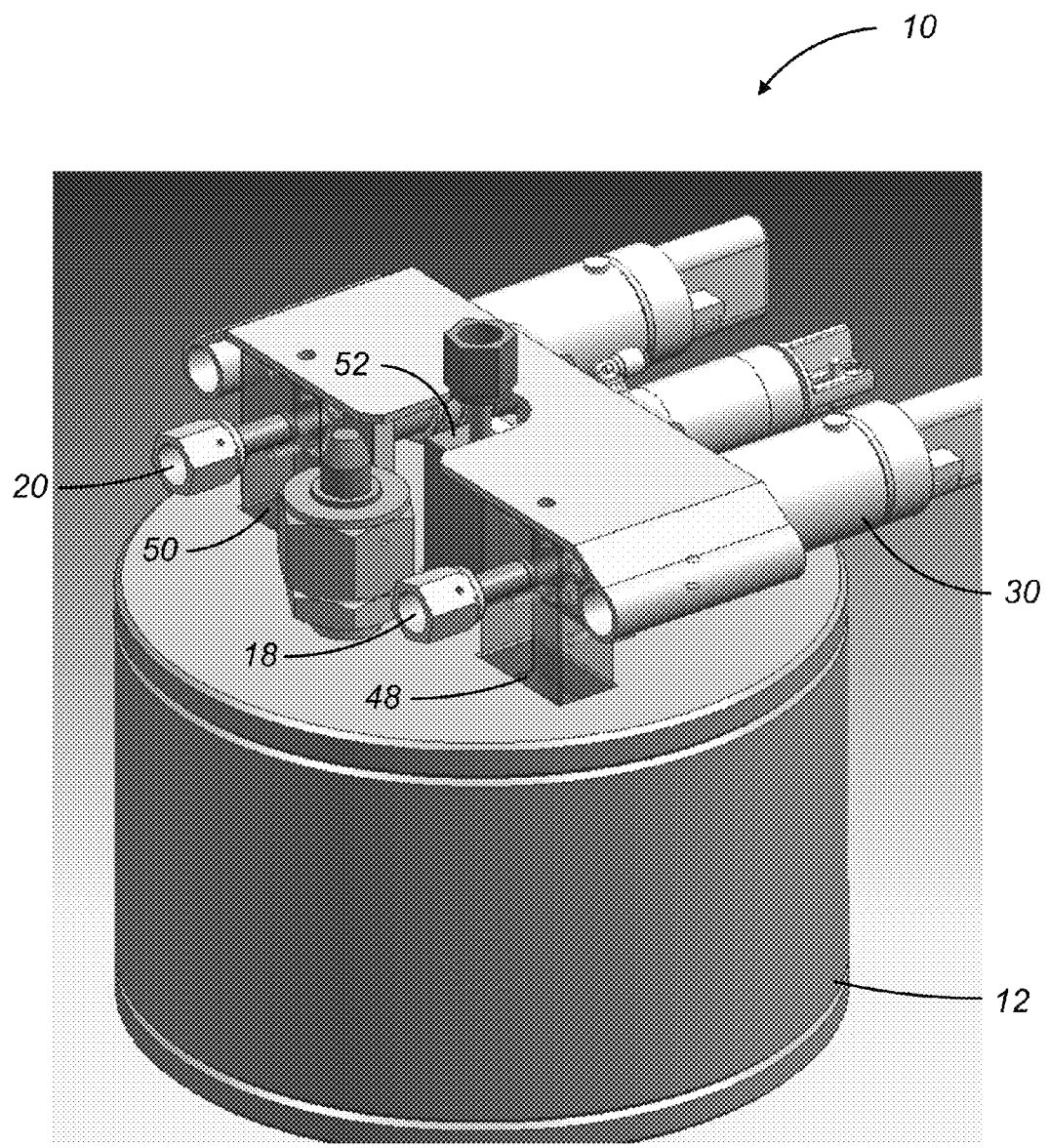
FIG. 2 is another perspective view of a reservoir assembly, as described in embodiments herein.

FIG. 2 shows the reservoir assembly 10 of FIG. 1 from a different viewing direction. Reservoir assembly 10 further includes an inlet valve interface member 48 that is coupled with the canister 12. The dual-function hybrid inlet valve 30 is coupled with the inlet valve interface member 48. The inlet valve interface member 48 includes internal fluid channels for communicating fluid between the inlet port 18 and the inlet valve 30 and between the inlet valve 30 and the canister 12. Reservoir assembly 10 further includes an outlet valve interface member 50 and a fill valve interface member 52, which are configured similar to the inlet valve interface member 48.

Reservoir assembly 10 (as shown in both FIGS. 1 and 2) has a configuration that provides a number of functional advantages. For example, the components exterior to the canister are disposed in close proximity to the top of the canister (e.g., within six inches from the top of the canister). This compact configuration results in a reservoir assembly that has reduced exterior fluid pathways as compared to the above described traditional reservoir assembly, thereby reducing the canister exterior regions that must be heated (e.g., by heat blankets) to maintain the reservoir assembly's contents within a required temperature range. The configuration of reservoir assembly 10 also has the inlet port 18 and the outlet port 20 in a horizontal and parallel orientation. As will be described in more detail below with reference to FIG. 4, such an orientation of the inlet and outlet ports provides for horizontal installation and removal of the reservoir assembly to and from a PDS. The handle receptacles provide the ability to use a lifting apparatus during installation and removal of the reservoir assembly.

Figure 3:
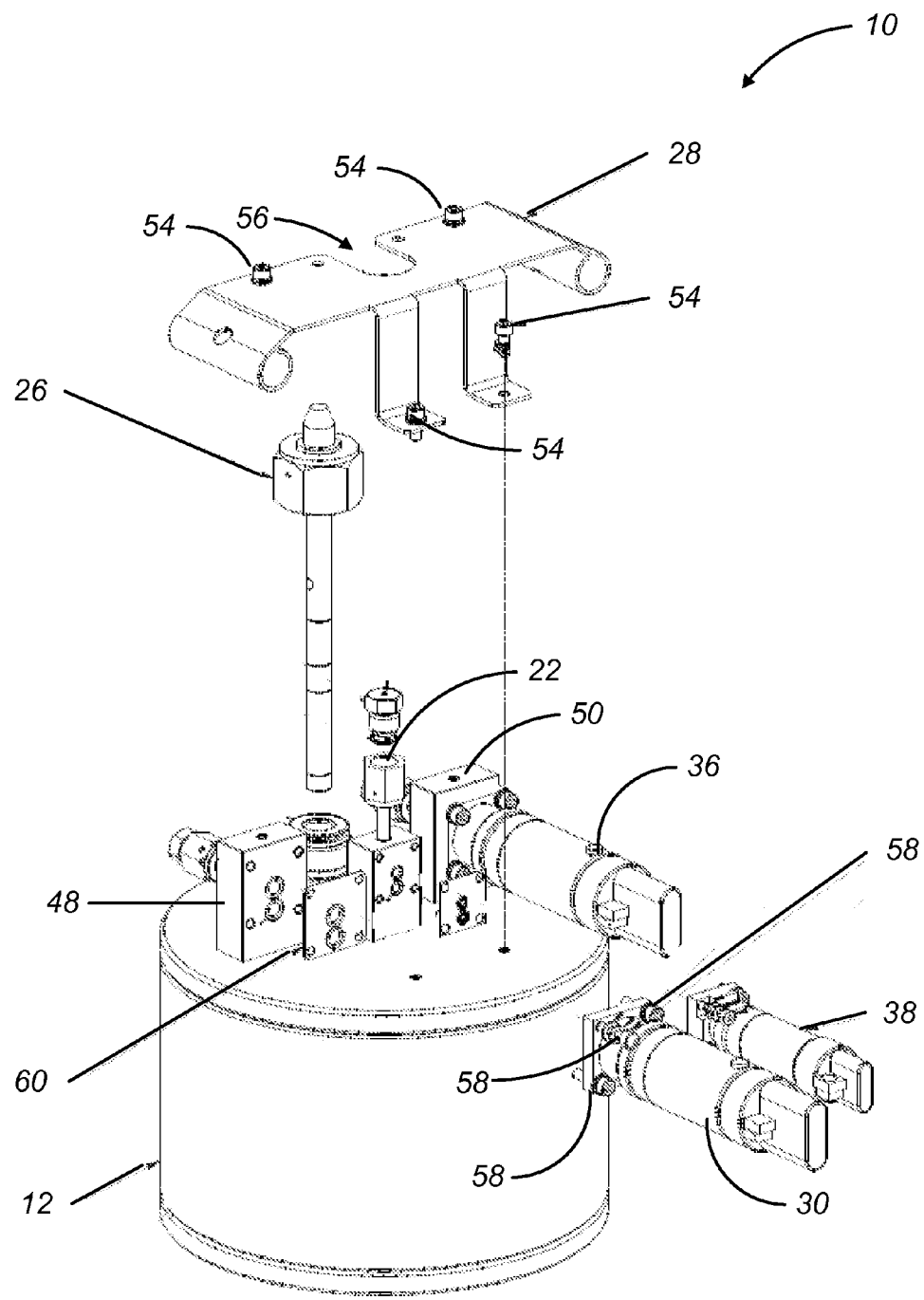
FIG. 3 is an exploded perspective view of a reservoir assembly, as described in embodiments herein.

FIG. 3 is an exploded perspective view of the reservoir assembly 10. FIG. 3 shows the handle assembly 28, which can be coupled with the canister 12 using four handle attachment bolts 54. Two of the handle attachment bolts 54 engage threaded bolt holes in the top of the canister and two of the handle attachment bolts engage threaded bolt holes located in the top of the inlet valve interface member 48 and the outlet valve interface member 50. The handle assembly includes a sculpted region 56 for providing clearance for the fill port 22. The dual-function hybrid inlet valve 30 is shown displaced from the inlet valve interface member 48. The inlet valve 30 couples with the inlet valve interface member by way of four inlet valve attachment bolts 58 (one bolt 58 is hidden from view). An inlet valve gasket 60 can be disposed between the inlet valve and the inlet valve interface member. A similar arrangement can be used for the fill valve 38 and the outlet valve 36. The level sensor assembly 26 is shown displaced from the canister.

Figure 4:
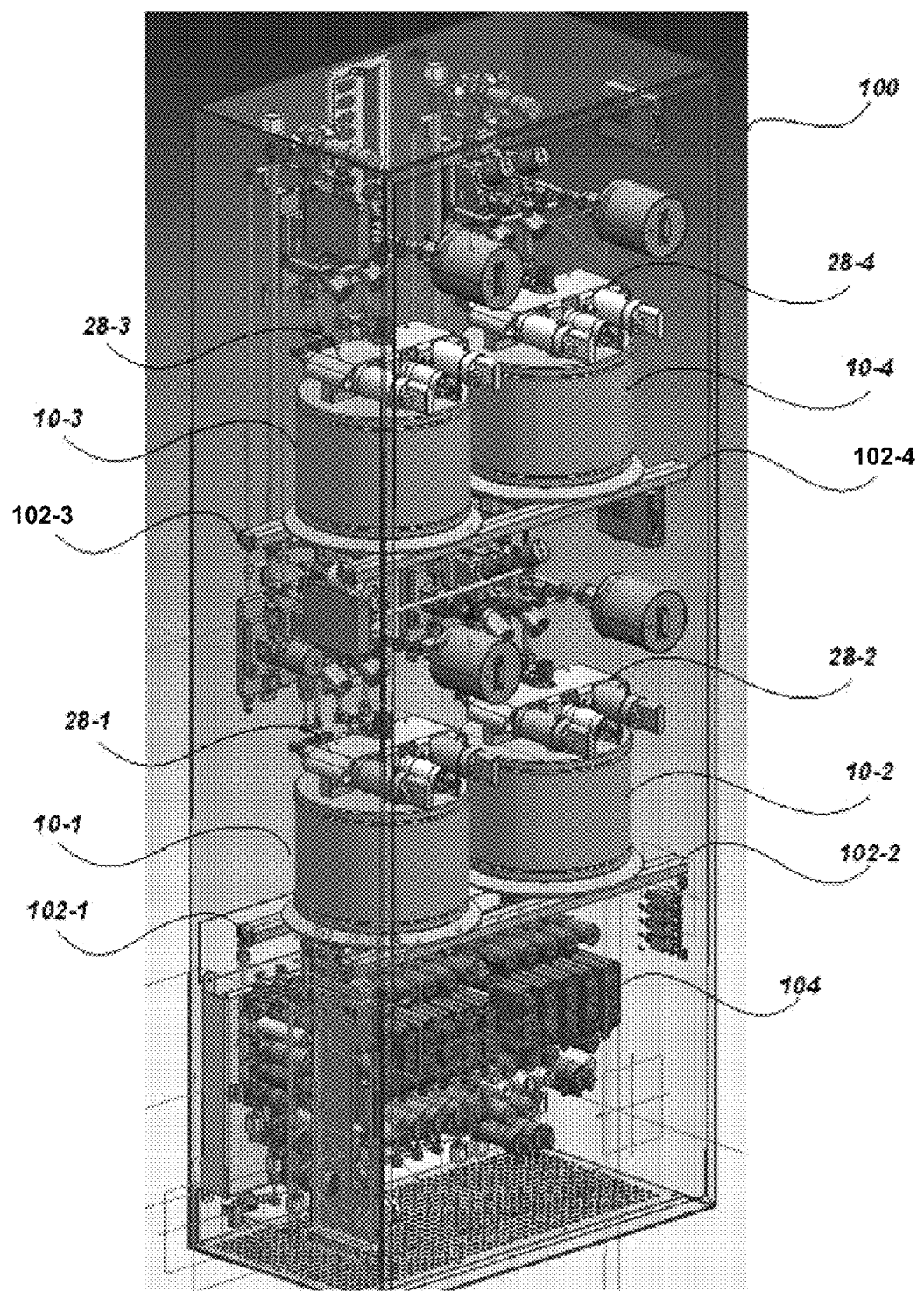
FIG. 4 is a perspective view of a precursor distribution system enclosure, showing four installed reservoir assemblies, as described in embodiments herein.

FIG. 4 is a perspective view of a PDS enclosure 100, showing four installed reservoir assemblies (10-1, 10-2, 10-3, 10-4), four support members (102-1, 102-2, 102-3, 102-4), and a bank of mass flow controllers 104. The four reservoir assemblies (10-1 through 10-4) are mounted into the PDS enclosure 100. Two of the reservoir assemblies (10-3 and 10-4) are mounted in an upper row and two of the reservoir assemblies (10-1 and 10-2) are mounted in a lower row. The upper and lower rows of reservoir assemblies (10-1 through 10-4) are positioned vertically on top of each other in the PDS enclosure 100. The reservoir assemblies (10-1 through 10-4) are each supported by two support members. The lower reservoir assemblies (10-1 and 10-2) are supported by support members (102-1 and 102-2) while the upper reservoir assemblies (10-3 and 10-4) are supported by support members (102-3 and 102-4). The inlet and outlet ports of the reservoir assemblies are connected to inlet and outlet supply lines of the PDS enclosure 100, respectively. The inlet and outlet supply lines can be configured to be horizontally oriented and parallel so as to facilitate ease of coupling with the inlet and outlet ports of the reservoir assemblies. The reservoir assemblies can be loaded and unloaded through the front of the PDS enclosure. During loading and unloading, a lifting mechanism can be used to lift/move the reservoir assemblies by way of the handle assemblies (28-1, 28-2, 28-3, 28-4). The reservoir assemblies can be loaded onto the support members and slid into position so that the inlet and outlet supply lines located on the PDS enclosure 100 can be connected to the inlet and outlet ports of the reservoir assemblies (10-1 through 10-4). In one embodiment, the support members (102-1 through 102-4) are adjustable so that after the reservoir assemblies (10-1 through 10-4) are placed on the support members (102-1 through 102-4), the reservoir assemblies can be maneuvered to align the inlet and outlet ports of the reservoir assemblies with the inlet and outlet supply lines. Once the inlet and outlet ports of the reservoir assemblies (10-1 through 10-4) are align with the inlet and outlet supply lines, a user can connect them using a gas line fitting such as an o-ring fitting, metal gasket face, etc.

Since the components exterior to the canister are disposed in close proximity to the top of the canister (e.g., within six inches from the top of the canister), more multiple reservoir assemblies can loaded vertically into the PDS enclosures 100 than could be done without this configuration. Additionally, the reduced exterior path way described above with reference to FIGS. 1-2 also allow for easier maneuverability of the reservoir assemblies (10-1 through 10-4) within the PDS enclosure 100. The bank of mass flow controllers 104 are coupled to the outlet of the reservoir assemblies (10-1 through 10-4) and are used to regulate the flow of material from the reservoir assemblies 10 to the substrate processing apparatus (not shown).

The reservoir assemblies (10-1 through 10-4) can be maneuvered by sliding them across the support members (102-1 through 102-4). In another embodiment, the support members (102-1 through 102-4) can be made to be adjustable so that the support members can be moved when the reservoir assemblies (10-1 through 10-4) are loaded on top. The support members (102-1 through 102-4) can be moved by either pushing them or by some more elaborate means such as a stepper motor or a hand cranking device that causes motion of the support member (102-1 through 102-4). The motion of the support members can be in all three directions (i.e., x, y, or z direction).

In accordance with an embodiment, a reservoir assembly is provided that includes a canister, which includes at least one sidewall, a top, and a bottom that encompass an interior volume therein. The reservoir assembly includes an inlet port in fluid communication with the interior volume and an outlet port in fluid communication with the interior volume. The reservoir assembly includes an inlet valve for controlling fluid communication between the inlet port and the interior volume. The reservoir assembly includes an outlet valve for controlling fluid communication between the outlet port and the interior volume. At least one of the inlet valve or the outlet valve includes a dual-function hybrid valve.

A reservoir assembly can involve a number of options. For example, the canister can be configured to contain a precursor gas. The inlet valve and the outlet valves can include a dual-function hybrid valve. A reservoir assembly can further include an inlet coupling for coupling the inlet port with a substantially horizontal inlet supply line and an outlet coupling for coupling the outlet port with a substantially horizontal outlet supply line, wherein the inlet and outlet supply lines can be substantially parallel. The inlet port and the outlet port can be in fluid communication with the interior volume through the top of the canister and each of the inlet and the outlet valves can be disposed below a horizontal plane that is offset above the top by six inches. A reservoir assembly can include a handle assembly that is demountably coupled with the canister. A handle assembly can include a first gripping surface and a second gripping surface. A handle assembly can include at least one substantially horizontal receptacle for receiving a lifting member. The first and/or second gripping surface can surround a substantially horizontal receptacle for receiving a lifting member. A reservoir assembly can include an inlet valve interface member that is coupled with the canister and the inlet valve can be demountably coupled with the inlet valve interface member. A reservoir assembly can include an outlet valve interface member that is coupled with the canister and the outlet valve can be demountably coupled with the outlet valve interface member. An inlet valve interface member can include a first inlet channel for fluid communication between the interior volume and the inlet valve and a second inlet channel for fluid communication between the inlet valve and the inlet port. An outlet valve interface member can include a first outlet channel for fluid communication between the interior volume and the outlet valve and a second outlet channel for fluid communication between the outlet valve and the outlet port. The inlet valve and/or the outlet valve can include a pneumatically actuated valve and a lock-out tag-out module. A reservoir assembly can include a fill port in fluid communication with the interior volume and can include a fill valve for controlling fluid communication between the fill port and the interior volume. A fill valve can include a dual-function hybrid valve. A reservoir assembly can include a fill valve interface member coupled with the canister and a fill valve can be demountably coupled with the fill valve interface member. A fill valve interface member can include a first fill channel for fluid communication between the interior volume and the fill valve and a second fill channel for fluid communication between the fill valve and the fill port.

In accordance with another embodiment, a distribution system is provided, wherein the distribution system includes an inlet fluid line, an outlet fluid line and a reservoir assembly. The inlet fluid line provides a material (e.g., a carrier gas) to a reservoir assembly. The outlet fluid line removes a material (e.g., the carrier gas and chemical(s)) from the reservoir assembly. The reservoir assembly includes a canister, which includes at least one sidewall, a top, and a bottom encompassing a volume therein. The reservoir assembly includes an inlet port, an outlet port, and a fill port, each being in fluid communication with the interior volume. The inlet port and the outlet port are configured to couple with the inlet fluid line and the outlet fluid line respectively. The reservoir assembly includes an inlet valve for controlling fluid communication between the inlet port and the interior volume. The reservoir assembly includes an outlet valve for controlling fluid communication between the outlet port and the interior volume. The reservoir assembly includes a fill valve for controlling fluid communication between the fill port and the interior volume. The inlet valve, the outlet valve and the fill valve are demountably coupled with the canister and include a dual-function hybrid valve.

A distribution system can involve a number of options. For example, a reservoir assembly can include a handle assembly that includes a first gripping surface and a second gripping surface. Each of the first and second gripping surfaces can surround a substantially horizontal receptacle for receiving a lifting member. A handle assembly can be demountably attached to the canister. An inlet valve, an outlet valve, and/or a fill valve can include a pneumatically actuated valve and can include a lock-out tag-out module. A reservoir assembly can include an inlet coupling for coupling the inlet port with the inlet fluid line and can include an outlet coupling for coupling the outlet port with the outlet fluid line. The inlet coupling and the outlet coupling can be configured so as to not require substantial vertical movement of the reservoir assembly during coupling of the reservoir assembly to the distribution system. The canister can be configured to contain a precursor gas.

It is understood that the examples and embodiments described herein are for illustrative purposes and the invention is not limited to these examples and embodiments. Various modifications or changes in light of the disclosed examples and embodiments will be suggested to a person skilled in the art and are to be included within the spirit and purview of this application and the scope of the appended claims. Numerous different combinations are possible, and such combinations are considered to be part of the present invention.

What is claimed is:

1. A reservoir assembly, comprising:
a canister comprising at least one sidewall, a top, and a bottom encompassing an interior volume therein;
an inlet port in fluid communication with the interior volume;
an inlet valve to control fluid flow between the inlet port and the interior volume;
an inlet valve interface member coupled with the canister, the inlet valve interface member including a first inlet channel between the interior volume and the inlet valve and a second inlet channel between the inlet valve and the inlet port, the inlet valve coupled with the inlet valve interface member such that a longitudinal axis of the inlet valve is substantially parallel to a top surface of the canister;
an outlet port in fluid communication with the interior volume;
an outlet valve to control fluid flow between the outlet port and the interior volume; and
an outlet valve interface member coupled with the canister, the outlet valve interface member including a first outlet channel between the interior volume and the outlet valve and a second outlet channel between the outlet valve and the outlet port, the outlet valve coupled with the outlet valve interface member such that a longitudinal axis of the outlet valve is substantially parallel to the top surface of the canister,
wherein the inlet valve and the outlet valve each comprise a dual-function hybrid valve that includes a pneumatic valve portion and a manual lock-out tag-out module.

2. The reservoir assembly of claim 1, wherein the canister contains a precursor gas.

3. The reservoir assembly of claim 1, wherein each of the inlet port and the outlet port is in fluid communication with the interior volume through the top of the canister, and wherein each of the inlet and outlet valves is disposed below a horizontal plane that is offset above the top by six inches.

4. The reservoir assembly of claim 1, wherein the inlet valve is demountably coupled with the inlet valve interface member and the outlet valve is demountably coupled with the outlet valve interface member.

5. The reservoir assembly of claim 1, further comprising:
an inlet coupling to couple the inlet port with a substantially horizontal inlet supply line; and
an outlet coupling to couple the outlet port with a substantially horizontal outlet supply line.

6. The reservoir assembly of claim 5, wherein the inlet supply line and the outlet supply line are substantially parallel.

7. The reservoir assembly of claim 1, further comprising:
a fill port in fluid communication with the interior volume; and
a fill valve to control fluid flow between the fill port and the interior volume, wherein the fill valve comprises a dual-function hybrid valve that includes a pneumatic valve portion and a manual lock-out tag-out module.

8. The reservoir assembly of claim 7, further comprising a fill valve interface member coupled with the canister, the fill valve being demountably coupled with the fill valve interface member.

9. The reservoir assembly of claim 8, wherein the fill valve interface member includes a first fill channel between the interior volume and the fill valve, and a second fill channel between the fill valve and the fill port.

10. The reservoir assembly of claim 1, further comprising a handle assembly demountably coupled with the canister, the handle assembly including a first gripping surface and a second gripping surface.

11. The reservoir assembly of claim 10, wherein the handle assembly includes at least one substantially horizontal receptacle for receiving configured to receive a lifting member that can be used to move the reservoir assembly.

12. The reservoir assembly of claim 11, wherein each of the first and second gripping surfaces surrounds a substantially horizontal receptacle configured to receive a lifting member that can be used to move the reservoir assembly.

13. A distribution system, comprising:
an inlet fluid line to provide a material to a reservoir assembly;
an outlet fluid line to remove the material from the reservoir assembly;
wherein the reservoir assembly further comprises:
a canister comprising at least one sidewall, a top, and a bottom encompassing an interior volume therein;
an inlet port, an outlet port, and a fill port in fluid communication with the interior volume, the inlet and outlet ports coupled with the inlet fluid line and the outlet fluid line respectively;
an inlet valve to control fluid flow between the inlet port and the interior volume;
an outlet valve to control fluid flow between the outlet port and the interior volume;
a fill valve to control fluid flow between the fill port and the interior volume;
an inlet valve interface member coupled with the canister, the inlet valve interface member including a first inlet channel between the interior volume and the inlet valve and a second inlet channel between the inlet valve and the inlet port, the inlet valve coupled with the inlet valve interface member such that a longitudinal axis of the inlet valve is substantially parallel to a top surface of the canister; and
an outlet valve interface member coupled with the canister, the outlet valve interface member including a first outlet channel between the interior volume and the outlet valve and a second outlet channel between the outlet valve and the outlet port, the outlet valve coupled with the outlet valve interface member such that a longitudinal axis of the outlet valve is substantially parallel to the top surface of the canister,
wherein each of the inlet valve, the outlet valve, and the fill valve is demountably coupled with the canister and comprises a dual-function hybrid valve that includes a pneumatic valve portion and a manual lock-out tag-out module.

14. The distribution system of claim 13, wherein the reservoir assembly further comprises:
an inlet coupling to couple the inlet port with the inlet fluid line; and
an outlet coupling to couple the outlet port with the outlet fluid line, wherein the inlet coupling and outlet coupling are configured to not require substantial vertical movement of the reservoir assembly during coupling of the reservoir assembly to the distribution system.

15. The distribution system of claim 13, wherein the canister contains a precursor gas.

16. The distribution system of claim 13, wherein the reservoir assembly further comprises a handle assembly that includes a first gripping surface and a second gripping surface, wherein each of the first and second gripping surfaces surrounds a substantially horizontal receptacle configured to receive a lifting member that can be used to move the reservoir assembly.

17. The distribution system of claim 16, wherein the handle assembly is demountably coupled with the canister.

* * * * *